United States Patent [19]

Mallik et al.

[11] Patent Number: 4,891,687

[45] Date of Patent: Jan. 2, 1990

[54] MULTI-LAYER MOLDED PLASTIC IC PACKAGE

[75] Inventors: Debendra Mallik, Mesa; Bidyut K. Bhattacharyya, Chandler, both of Ariz.

[73] Assignee: Intel Corporation, Santa Clara, Calif.

[21] Appl. No.: 303,035

[22] Filed: Jan. 27, 1989

Related U.S. Application Data

[63] Continuation of Ser. No. 2,144, Jan. 12, 1987, abandoned.

[51] Int. Cl.⁴ .................... H01L 23/10; H01L 23/48; H01L 23/12
[52] U.S. Cl. .......................................... 357/70; 357/74
[58] Field of Search .............. 357/80, 70, 74; 174/52, 174/68.5; 261/414

[56] References Cited

U.S. PATENT DOCUMENTS

| | | | |
|---|---|---|---|
| 3,784,883 | 1/1974 | Duncan et al. | 317/234 |
| 4,168,507 | 9/1979 | Yester | 357/51 |
| 4,541,035 | 9/1985 | Carlson et al. | 361/414 |
| 4,577,214 | 3/1986 | Schaper | 357/80 |
| 4,595,945 | 6/1986 | Graver | 357/70 |
| 4,608,592 | 8/1986 | Miyamoto | 357/74 |
| 4,639,760 | 1/1987 | Granberg et al. | 357/75 |
| 4,675,717 | 6/1987 | Herrero et al. | 357/80 |
| 4,680,613 | 7/1987 | Daniels et al. | 357/70 |
| 4,705,917 | 11/1987 | Gates et al. | 357/74 |

FOREIGN PATENT DOCUMENTS

| | | |
|---|---|---|
| 1245710 | 12/1969 | United Kingdom . |
| 1499889 | 2/1975 | United Kingdom . |
| 2107116 | 9/1982 | United Kingdom . |

*Primary Examiner*—Rolf Hille
*Assistant Examiner*—S. V. Clark
*Attorney, Agent, or Firm*—Blakely, Sokoloff, Taylor & Zafman

[57] ABSTRACT

A multi-layered molded plastic package for encapsulating an integrated circuit is described. The package includes a carrier having a double-layered metal plate which are separated by an adhesive coated insulation tape. A second insulating tape layer is used to bond externally extending leads onto one of the metal plates. Power and ground connections from the terminals of the integrated circuit are made to each of the plates, respectively, as are the power and ground lead connections to the two plates. The power and ground planes remove the requirement for direct physical connection between the power and ground terminals of the integrated circuit and their respective leads.

10 Claims, 5 Drawing Sheets

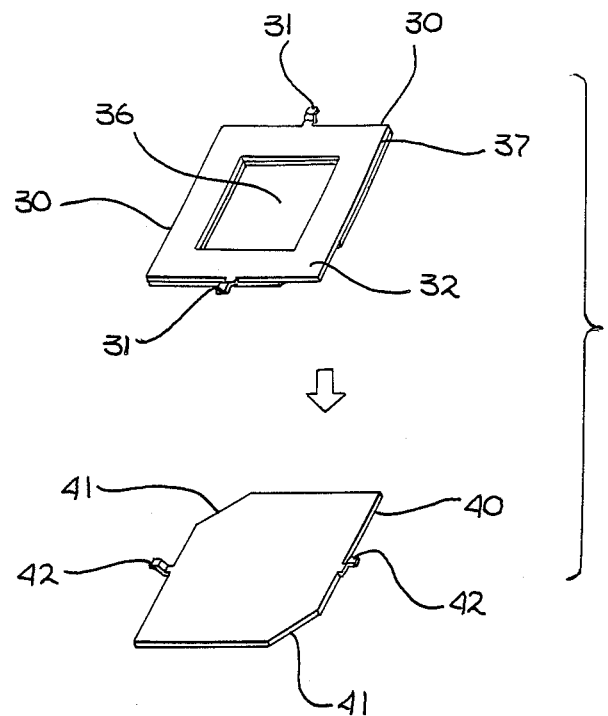
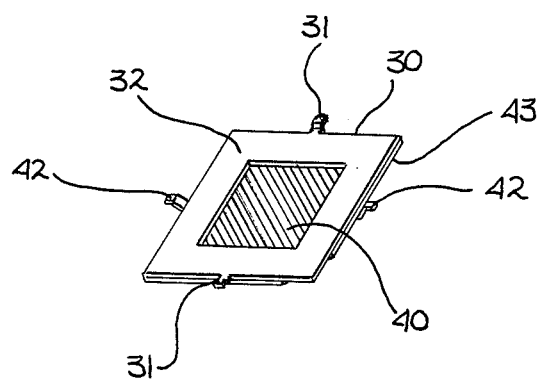

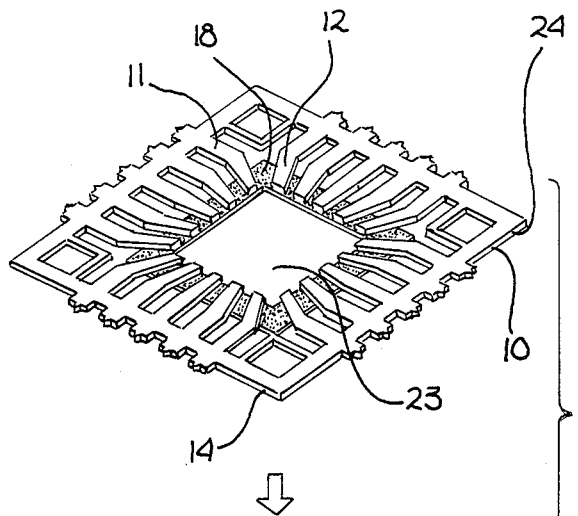
Fig. 9
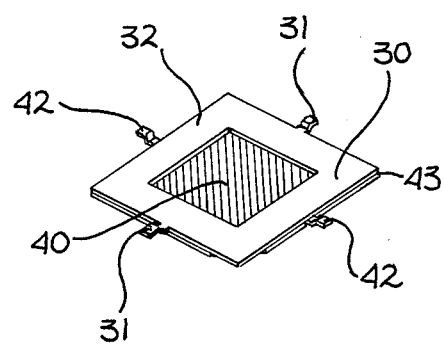
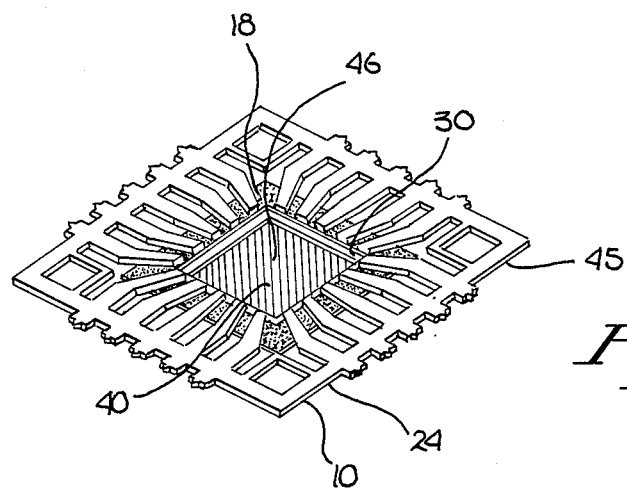
Fig. 10

MULTI-LAYER MOLDED PLASTIC IC PACKAGE

This is a continuation of application Ser. No. 002,144 filed Jan. 12, 1987, now abandoned.

BACKGROUND OF THE INVENTION

1. Field of the Invention

The present invention relates to the field of plastic encapsulation of semiconductor devices and more specifically to the encapsulation of multi-lead integrated circuits within a plastic carrier.

2. Prior Art

During the early development of encapsulating integrated circuits, the integrated circuits were typically packaged in a metal or a ceramic shell. Although ceramic encapsulation is effective, ceramic insulation is costly and reflect a sizable percentage of the total cost of manufacturing an integrated circuit chip. More recently, plastic encapsulation techniques have been devised which substantially lower the cost of packaging an integrated circuit device.

In a typical plastic packaging technique, an integrated circuit, usually in a form of a die, is placed proximate to a leadframe. The chip or the die is then wired such that various terminals of the integrated circuit are physically connected to the leads of the leadframe by wires. Next, the integrated circuit chip is bonded and potted such that the chip is encapsulated within the plastic package and only the leads extend externally of the package.

The conventional single-layer molded plastic package using metal leads as known in the prior art typically require one-to-one connection of the various integrated circuit terminals on the die to the leads. The number and position of power and ground leads of the package were directly dependent on the number and position of the power and ground bond pads on the die. Although multiple connections could be made to the various power and ground leads from the die pads, such practice places additional constraint in positioning the various pads. Also, in certain high current applications, additional pads and leads are needed to shunt the additional current. Increase in the number of power and ground pads on the die which result in the increase in the number of leads ultimately cause high electrical inductance and low capacitance to exist between the power and ground pads, such that these properties cause low speed response of the integrated circuit. Further, increase in the number of bond pads on a single layer package dictates an increase in the package lead count resulting in an increase in the size of the package and inhibiting any attempt at package shrink.

Also due to the fact that a single layer molded plastic package is basically flat and causes all I/O (input/output) to ground lead current loops to lie in one plane, cross talk on high lead count packages is appreciably significant to cause communication degradation.

Where prior art single-layer molded plastic packages are quite adequate for various low lead count or low speed integrated cirucuits, a high lead count, high speed integrated circuit implemented in a compact plastic package is difficult to achieve using prior art techniques. It is appreciated then that what is needed is a plastic package for encapsulating a high speed, high lead count integrated circuit, such as a 32-bit microprocessor chip, in a compact system.

SUMMARY OF THE INVENTION

The present invention discloses a multi-layered molded plastic package for encapsulating an integrated circuit. The plastic package includes a multi-layered carrier having a power plane and a ground plane, which are formed from flat metal plates. The power plane operates as a base and the ground plane is disposed to overlie the power plane. A center area of the ground plane is stamped out to provide an opening for the placement of the integrated circuit.

A tape having a polyimide adhesive is used to bond the two plates together and also to act as an insulator. Then a second insulation tape layer using the polyimide adhesive is used to bond leads to the second plate. After attaching the integrated circuit onto the power plane in the opening provided within the ground plane, wires are used to couple power pads on the integrated circuit to the power plane and ground pads to the ground plane.

The use of ground and power planes removes the requirement of directly connecting ground and power terminals to various ground and power leads. The use of the ground and power planes reduces package size, improves thermal performance and reduces lead and mutual inductance.

BRIEF DESCRIPTION OF THE DRAWINGS

FIG. 7 shows the assembly of FIG. 6 being joined to a power plane.

FIG. 8 shows the completed assembly of FIG. 7.

FIG. 9 shows the bonding of the leadframe of FIG. 3 and the double-layered plate assembly of FIG. 8.

FIG. 10 shows the completed assembly of FIG. 9.

DETAILED DESCRIPTION OF THE PREFERRED EMBODIMENT

A multi-layer molded plastic integrated circuit package which provides for a compact encapsulation is described. In the following description, numerous specific details are set forth such as specific shapes, material, etc., in order to provide a thorough understanding of the present invention. It will be obvious, however, to one skilled in the art that the present invention may be practiced without these specific details. In other instances, well-known techniques have not been described in detail in order not to unnecessarily obscure the present invention.

Figure 1:
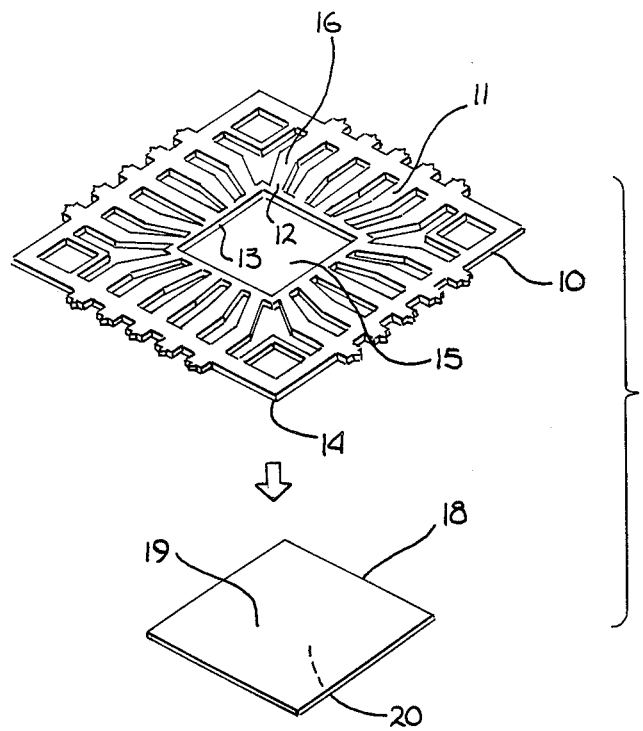
FIG. 1 shows a leadframe and an adhesive coated insulation tape which is bonded onto the leadframe.

Referring to FIG. 1, a leadframe is shown having a plurality of leads 11 held in place by an outer ring 14. Lead tips 12 are held in place by inner ring 13 to prevent damage to them. Leadframe 10 is constructed from a number of various metals which are well-known in the prior art for constructing leads. Leadframe 10 of the present invention is flat and is formed by stamping or etching it from a desired metal sheet. Inner ring 13 functions as a boundary for opening 15 at the center of the leadframe 10. Inner ring 13, outer ring 14 and opening 15 of the preferred embodiment is square in shape to accommodate a square-shaped integrated circuit (IC), however, any such shape being arbitrary and determined by the shape of the integrated circuit which will reside within the opening 15. As practiced with the present invention, the lead tips 12 are silver plated on upper surface 16 by a well-known prior art process for subsequent gold wire bonding.

Figure 2:
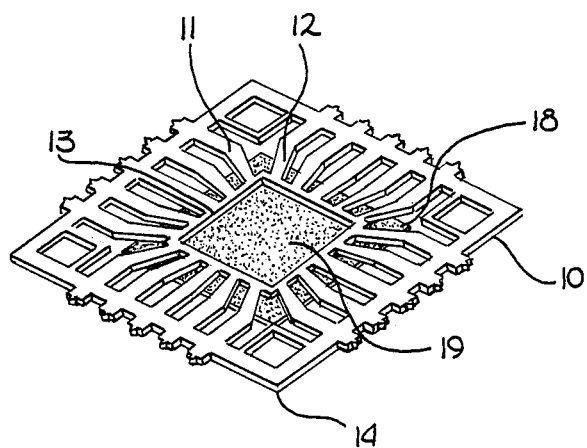
FIG. 2 shows a completed assembly of FIG. 1.

An insulation tape 18, such as Kapton TM tape manufactured by E. I. du Pont de Nemours & Co., which is coated with a polyimide adhesive on both surfaces 19 and 20 is used. Polyimide coated tape 18 is cut such that its dimensions are larger than opening 15 of leadframe 10. Surface 19 of tape 18 is placed against non-silver plated side of leadframe 10 such that tape 18 covers opening 15. Leadframe 10 and tape 18 are subjected to a hot tack operation well-known in the prior art to adhere tape 18 to lead frame 10. However, during this hot tack process, the adhesive coating on surfaces 19 and 20 are not completely cured. FIG. 2 shows the completion at the end of the hot tack process, wherein tape 18 and leadframe 10 are joined to enclose opening 15. Although a particular material and adhesive are used in the preferred embodiment, it is appreciated that other insulators and adhesives well-known in the prior art will perform an equivalent function.

Figure 3:
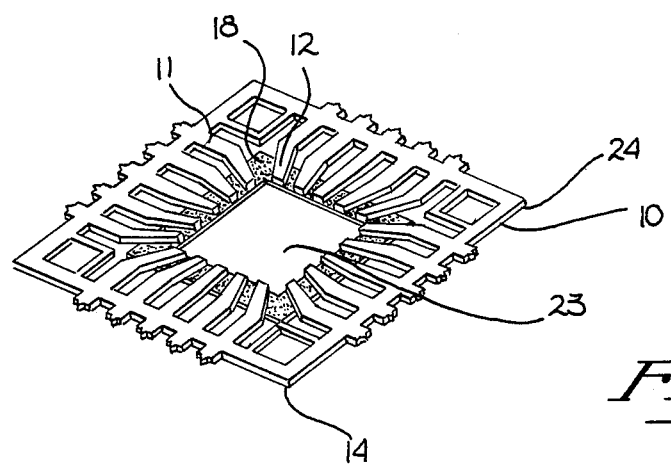
FIG. 3 shows the assembly of FIG. 2 after stamping out a center area and removing an inner ring holding various lead tips in place.

Referring to FIG. 3, a center opening 23 is formed by stamping out a portion of tape 18 and inner ring 13. At this stage tape 18, having an opening 23, is attached to lead tips 12. The various leadtips 12 are separated from each other due to the removal of inner ring 13. The boundary dimensions of opening 23 must be of such size as to accommodate an IC chip or die within opening 23. At this stage of manufacture, assembly 24 is formed.

Figure 4:
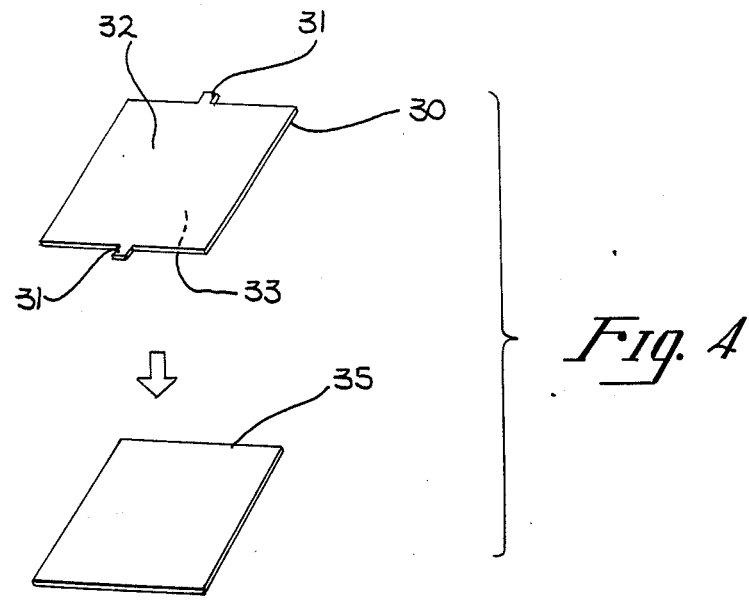
FIG. 4 shows a ground plane and a second adhesive coated insulation tape.
Figure 5:
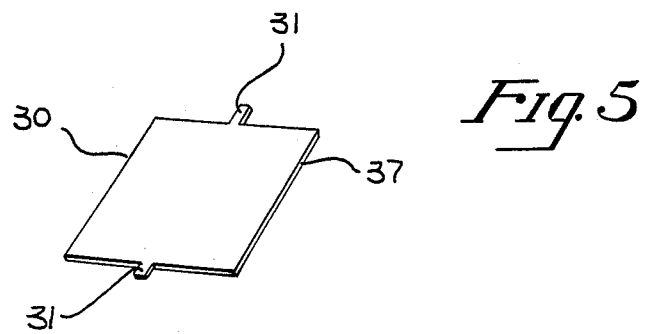
FIG. 5 shows a completed assembly of FIG. 4.

Referring to FIG. 4, a metal plate 30 is stamped to have dimensions substantially similar to the dimensions of tape 18 of FIG. 1. Plate 30 of the preferred embodiment is formed from a copper material and is silver plated on one surface 32. Plate 30 includes tabs 31 which will mate with appropriate leads 11 of leadframe 10 of FIG. 3. Tabs 31 are raised slightly from the plane of plate 30. Tabs' 31 surfaces are treated by a metallurgical process, such as gold or nickel plating, to help bond tabs 31 to leadframe 10. The preferred embodiment uses gold plating on tabs 31. Then, tape 35 having polyimide adhesive on both sides is cut to match the dimensions of plate 30 and then by the use of the polyimide adhesive as previously explained in reference to FIG. 1 is mated to the non-plated side 33 of plate 30 by the hot tack process. The resulting attachment of plate 30 to tape 35 is shown in FIG. 5 as unit 37.

Figure 6:
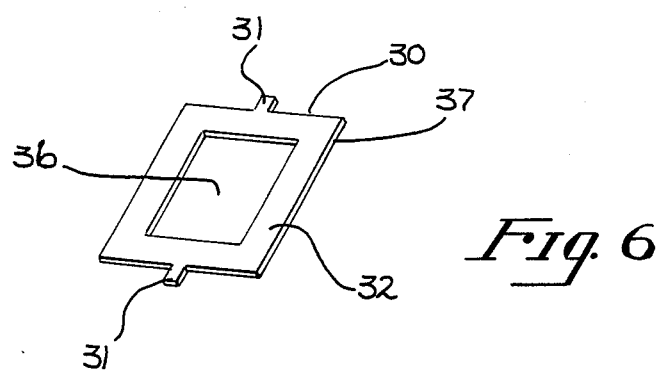
FIG. 6 shows the completed assembly of FIG. 5 with a center opening stamped out.

Referring to FIG. 6, opening 36 is stamped in plate unit 37. Opening 36 has dimensions to enable IC die to be placed within. However, opening 36 has dimensions which are smaller than opening 23 of FIG. 3 such that portion of surface 32 of unit 37 will reside within opening 23 when properly mated.

Referring to FIG. 7, a metal plate 40 constructed from a material equivalent to that of plate 30 of FIG. 4, is stamped to have dimensions substantially equivalent to that of plate 30. In the preferred embodiment opposing corners 41 are notched to have a slight angular cut.

Tabs 42 are formed in an equivalent manner to that of tabs 31 of plate 30 of FIG. 4 to mate with various corresponding leads 11 which will be coupled to plate 40. Tabs 42 are positioned at separate locations than tabs 31. Plate unit 37 is mated to plate 40 such that polyimide coated tape 35 is sandwiched between plate 30 and 40. The completed combination of mated plate 30, tape 35 and plate 40 is shown in FIG. 8 as assembly 43.

Referring to FIG. 9, assembly 24 is now mated to assembly 43 such that tape 18 is sandwiched between leadframe 10 and plate 30. The completed assembly 45, having a center area 46, is shown in FIG. 10. The preferred embodiment is comprised of a substantially flat and square assembly 45, although such shape being arbitrarily dependent on the size and shape of the integrated circuit being encapsulated. Then, assembly 45 is cured under thermo-compression to permanently join all elements 10, 18, 30, 35, 40. Assembly 24 is comprised of plate 40 which functions to provide a base for area 46. Tape 35 and plate 30 overlie plate 40. Next, tape 18 and leads 11 of leadframe 10 overlie plate 30, such that a portion of plate 30 is exposed. In the preferred embodiment, plate 40 forms a power plane 52 and plate 30 forms a ground plane 53.

The tabs 31 and 42 when properly formed will extend past the outer boundary of tape 18. Due to the slight rise, the tabs 31 and 42 will extend from its respective plates 30 and 40 to mate with various corresponding leads 11 along their underside. The tabs 31 and 42 are bonded to the leads 11 by using one of various prior art methods, such as parallel gap welding, ultrasonic bonding, compliant bonding, wobble bonding, or thermo-compression (pulsed solder reflow).

Figure 11:
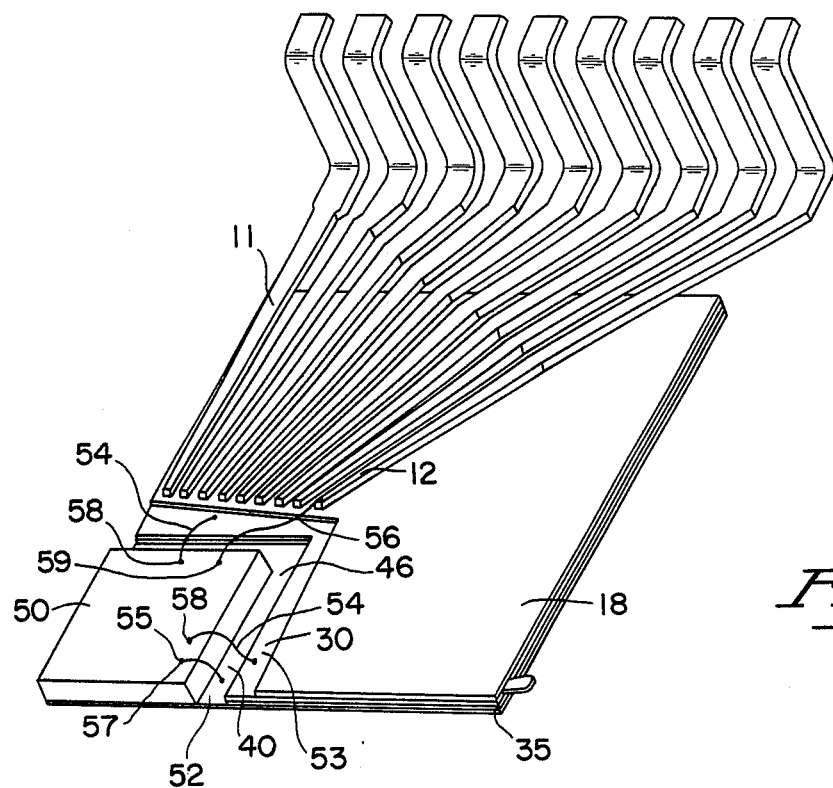
FIG. 11 shows a portion of the assembly of FIG. 10 and the bonding of an integrated circuit and some of its terminal connections.

Referring to FIG. 11, an IC in a form of a die 50 is placed within the center area 46 to lie upon power plane 52. A variety of prior art techniques, such as adhesive die attach, is utilized to bond die 50 onto power plane 52. Wires 55 are used to couple pad 57 on die 50 to power plane 52 and wires 54 are bonded to couple pads 58 to ground plane 53. Other wires, such as wire 56, are used to couple other pads 59 of die 50 to various leads at lead tip 12.

Figure 12:
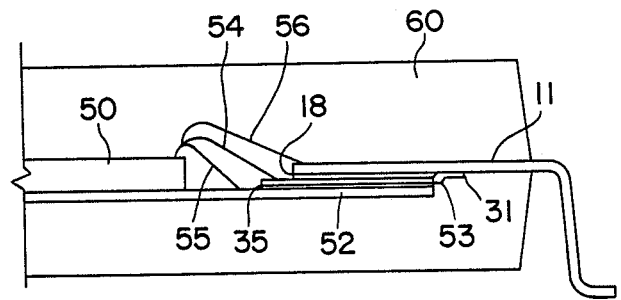
FIG. 12 shows a cross-sectional view of a completed package of the present invention.

Referring also to FIG. 12, the proper positioning of the various tabs 31 and 42 in the earlier formation of the ground and power planes is apparent in that tabs 31 and 42 mate with appropriate leads 11 to couple the ground plane 53 and the power plane 52. In the preferred embodiment, tabs 31 and 42 are bonded prior to the placement of wires 54-56 as earlier described. Although only one of the ground plane tabs 31 is shown in the FIGS. 11 and 12, the other ground tabs 31 and power tabs 42 are mated to their respective leads 11 in an equivalent manner. The various wire bondings are accomplished by bonding wires 54-56 to the silver spot-plated planes 52-53 and to the silver-plated lead tips 12.

It is appreciated that various bonding techniques or configurations may be utilized to practice the present invention. In an alternate embodiment, instead of using tabs 31 and 42 at the outer edge of the planes 52 and 53, heavy gage wires may be utilized to interconnect the ground and the power planes at lead tips 12. Further, decoupling capacitors can be surface mounted on the plane between the power and the ground plane. Finally, the complete unit is encapsulated in a plastic package 60 by a well-known stamping and forming process used in the manufacture of semiconductor devices, outer ring 14 of lead frame 10 is removed and various leads 11 are separated to form individual leads 11 of an IC package.

Assembly 45 is worked by a well-known conventional plastic package assembly technique.

Various advantages are derived due to the performance improvement of the present invention. A critical improvement is that the inductance of power and ground paths of the IC will be drastically reduced, because major portions of the lead length is replaced by low inductance metal planes. Capacitance of the power and ground paths will also increase to a value typically near 100 pF thereby helping to reduce noise in the power supply. As stated earlier, decoupling capacitors can be placed within the package connecting the ground and power planes to further reduce the lead inductance of the IC. The lead inductance is determined, not only by the leads 11, but also by the lead length in the external circuit. That is, the presence of the ground and power planes will reduce the inductance of various I/O lines which will be coupled to the leads 11 of the IC and will aid in maintaining a more uniform value of inductance per unit length. Therefore, the present invention will result in a package which will not be highly geometry dependent as was the case in prior art devices without the use of ground and power planes.

Unlike in prior art plastic packages without the use of ground and power planes, the present invention does not require a one-to-one connection of the power and ground terminals on the die to the leads, thereby providing independent control over the position and number of the ground and power terminals on the die and on the package leads. Also, because of the favorable gains in the package inductance and capacitors the number of ground and power leads required for equivalent performance is much less compared to prior art devices.

The overall contribution of the various advantages in performance will result in smaller package sizes for the device. The use of metal plates as ground and power planes also contributes to the distribution of heat generated by the IC, thereby presenting a thermal performance improvement. For "hot devices" this will eliminate the need for internal "heat-spreaders".

Other advantages which result from the practice of the present invention are as follows: During the manufacturing process, the lead tips in the leadframe are protected by adhesive coated tapes and by the metal ring, thereby preventing damage. When tabs are used, the ground and power lead tips need not be present for wire bonding such that the ground and power lead tips can be cut back with respect to other lead tips, freeing crucial real estate near the IC wire bonding areas. Further, die pads no longer need the support of tie bars, such that further real estate is available for additional I/O leads. Also, mutual inductance between the leads, as well as between the I/O lines, will be reduced because current loops between power and ground potential occur perpendicular to the planes and not between the leads, as was the case in the prior art.

Thus a multi-layer plastic package for encapsulating an integrated circuit is described.

We claim:

1. A plastic package for a high lead count integrated circuit, comprising:
    an opaque plastic encapsulating molded shell;
    an integrated circuit carrier encapsulated within said molded shell;
    a substantially planar leadframe comprised of a plurality of leads;
    said plurality of leads, which includes a power lead and a power return lead, extending into said molded shell and coupled to said carrier;
    said carrier comprising:
    (a) a first conducting plate, wherein said integrated circuit is disposed on and supported by said first plate;
    (b) a second conducting plate overlaying said first conducting plate and disposed about said integrated circuit;
    (c) a first insulator adhesive tape disposed between and bonded to said first and second conducting plates;
    (d) a second insulator adhesive tape disposed between and bonded to said second plate and said plurality of leads;
    (e) wherein power terminals of said integrated circuit and said power lead are electrically coupled to one of said conducting plates, and wherein power return terminals of said integrated circuit and said power return lead are electrically coupled to the other of said conducting plates.

2. The plastic package defined in claim 1, wherein said plates are comprised of copper.

3. The plastic package defined in claim 2, wherein said power terminals of said integrated circuit are coupled to said first plate and said ground terminals are coupled to said second plate.

4. The plastic package defined in claim 3, wherein said first and second plates further include angular extensions extending beyond the outer boundary of said insulators disposed on its outer edge for coupling said plates to various predetermined power and ground leads.

5. The plastic package defined in claim 4, wherein other terminals of said integrated circuit are selectively coupled directly to lead tips of various predetermined corresponding leads.

6. The plastic package defined in claim 5, wherein said carrier is substantially flat.

7. The plastic package defined in claim 6, wherein said carrier is rectangular in shape to hold a substantially rectangular-shaped integrated circuit.

8. The plastic package defined in claim 3, wherein a capacitor device is coupled between said first plate and said second plate for decoupling process.

9. A carrier for a high lead semiconductor device having a plurality of terminals, consisting of:
    an assembly consisting of:
    (a) a substantially planar leadframe comprised of a plurality of leads including power and ground leads and a substantially rectangular first center opening to accommodate said device;
    (b) a substantially planar first conducting plate having a substantially rectangular second center opening accommodating said device and correspondingly similar in dimensions to said first opening in said leadframe;
    (c) a first insulator tape having a substantially rectangular third center opening disposed on the upper surface of said first conducting plate bonding said upper surface of said first conducting plate to the bottom surface of said leadframe;
    (d) a substantially planar second conducting plate;
    (e) a second insulator tape disposed on the upper surface of said second conducting plate bonding said upper surface of second conducting plate to the bottom surface of said first conducting plate;

(f) said device bonded to the upper surface of said second conducting plate such that said first, second and third center openings are aligned and the corresponding said leadframe, said first conducting plate and said first insulator tape of said first, second and third center openings are disposed on top of said second insulator tape and surround said device;

(g) said device having a first terminal of said plurality of terminals coupled to said first conducting plate and having a second terminal of said plurality of terminals coupled to said second conducting plate;

(h) said device having the remaining terminals of said plurality of terminals electrically coupled to one end of the corresponding plurality of leads of said leadframe;

a molded plastic shell encapsulating said assembly such that the other end of said plurality of leads of said leadframe not coupled to remaining terminals of said plurality of terminals extends external to said plastic shell.

10. The carrier defined in claim 9, wherein said plates and said leadframe are comprised of copper.

* * * * *